US006501257B1

(12) United States Patent
Elmore (10) Patent No.: US 6,501,257 B1
(45) Date of Patent: Dec. 31, 2002

(54) HIGH SPEED MULTIFUNCTION TESTING AND CALIBRATION OF ELECTRONIC ELECTRICITY METERS

(75) Inventor: David D. Elmore, Somersworth, NH (US)

(73) Assignee: General Electric Company, Schenectady, NY (US)

( * ) Notice: Subject to any disclaimer, the term of this patent is extended or adjusted under 35 U.S.C. 154(b) by 140 days.

(21) Appl. No.: 09/645,847

(22) Filed: Aug. 24, 2000

Related U.S. Application Data

(62) Division of application No. 08/565,368, filed on Nov. 30, 1995, now Pat. No. 6,133,720.

(51) Int. Cl.[7] .......................... G01R 35/04; G01R 21/06
(52) U.S. Cl. .......................................... 324/74; 324/142
(58) Field of Search ........................ 324/74, 130, 141, 324/142, 107; 702/85, 60, 61

(56) References Cited

U.S. PATENT DOCUMENTS

| 2,957,133 A | 10/1960 | Burkhart, Jr. et al. ........ 324/74 |
| 3,409,829 A | 11/1968 | Elmore et al. ................ 324/74 |
| 3,480,949 A | 11/1969 | Charbonnier et al. ..... 324/99 D |
| 3,534,257 A | 10/1970 | Charap et al. ............ 324/99 D |
| 3,914,758 A | 10/1975 | Inge ............................ 340/336 |
| 3,955,138 A | 5/1976 | Milkovic ..................... 324/107 |
| 4,536,744 A | 8/1985 | Brown ...................... 324/99 D |
| 5,017,860 A | 5/1991 | Germer et al. .............. 324/142 |
| 5,061,890 A | * 10/1991 | Longini ...................... 324/142 |
| 5,325,048 A | * 6/1994 | Longini ........................ 324/74 |
| 5,539,304 A | 7/1996 | Payne et al. ................... 324/74 |

* cited by examiner

Primary Examiner—Ernest Karlsen
(74) Attorney, Agent, or Firm—Cantor Colburn LLP (57) ABSTRACT

High speed multifunction testing and calibration of electronic electricity meters comprises whole cycle synchronized testing. More specifically, start and end test commands defining a test interval synchronized to whole cycles of the pulsating a.c. potentials and currents are signaled by a meter under test (MUT) to a plurality of standard meters, during which multiple electrical quantities are accumulated by both the MUT and the standard meters. The MUT accumulated quantities and the accumulated quantities of the standard meters are communicated to the external test device for comparison. These comparisons may be used by the external test device to calculate coefficients for correcting or calibrating the MUT. The coefficients are transmitted to the MUT where they are incorporated into the algorithms for calculation of the desired electrical quantities.

12 Claims, 7 Drawing Sheets

| Quantity | Phase A | Phase B | Phase C |
|---|---|---|---|
| $V^2h$ (all) | $\sum_{k=1}^{K} e_{ak}^2$ | $\sum_{k=1}^{K} e_{bk}^2$ | $\sum_{k=1}^{K} e_{ck}^2$ |
| $V^2h$ (fund) | $\sum_{k=1}^{K} e_{a1k}^2$ | $\sum_{k=1}^{K} e_{b1k}^2$ | $\sum_{k=1}^{K} e_{c1k}^2$ |
| $I^2h$ (all) | $\sum_{k=1}^{K} i_{ak}^2$ | $\sum_{k=1}^{K} i_{bk}^2$ | $\sum_{k=1}^{K} i_{ck}^2$ |
| Wh (all) | $\sum_{k=1}^{K} e_{ak} i_{ak}$ | $\sum_{k=1}^{K} e_{bk} i_{bk}$ | $\sum_{k=1}^{K} e_{ck} i_{ck}$ |
| Wh (fund) | $\sum_{k=1}^{K} e_{a1k} i_{a1k}$ | $\sum_{k=1}^{K} e_{b1k} i_{b1k}$ | $\sum_{k=1}^{K} e_{c1k} i_{c1k}$ |
| varh (all) | $\sum_{k=1}^{K} e''_{ak} i''_{ak}$ | $\sum_{k=1}^{K} e''_{bk} i''_{bk}$ | $\sum_{k=1}^{K} e''_{ck} i''_{ck}$ |
| varh (fund) | $\sum_{k=1}^{K} e''_{a1k} i''_{a1k}$ | $\sum_{k=1}^{K} e''_{b1k} i''_{b1k}$ | $\sum_{k=1}^{K} e''_{c1k} i''_{c1k}$ |
| $In^2h$ | $\sum_{k=1}^{K} (i_{ak} + i_{bk} + i_{ck})^2$ | | |

HIGH SPEED MULTIFUNCTION TESTING AND CALIBRATION OF ELECTRONIC ELECTRICITY METERS

CROSS-REFERENCE TO RELATED APPLICATIONS

This application is a divisional application of U.S. application Ser. No. 08/565,368 filed Nov. 30, 1995, now U.S. Pat. No. 6,133,720, which is hereby incorporated by reference in its entirety.

BACKGROUND OF THE INVENTION

The present invention relates to testing and calibration of electronic electricity meters. More specifically, the present invention relates to high speed multifunction testing and calibration of electronic electricity meters.

Calibration of electricity meters is typically verified by comparison of a meter under test (MTU) to a standard, or reference, meter for a time interval. The initiation of the time interval being signaled by the meter under test. The standard meter and MUT measure the same, or proportionate, electrical loads during the test interval. This has been the preferred way to test electricity meters for the last fifty years. With electromechanical single function electricity meters, the test interval corresponds to an exact number of revolutions of the meter disk for the MUT. With electronic meters, the test interval corresponds to some internal procedural step, or threshold. With either kind of meter, the test interval corresponds to a known quantum of electricity (known by the measurement of the standard meter) measured by the MUT.

Typically, prior to the start of the test interval, several seconds are allowed for loads to be established and meters to reach practically steady-state conditions; known as on the fly testing. Testing of individual elements, or stators, of polyphase meters has been carried out by a sequence of tests: one for each element and one for all elements combined. Additionally, the pulsating nature of a.c. quantities require extended test intervals to reduce their relative effects on the accuracy of comparisons where the MUT and the standard have different time characteristics, effective level of filtering, or smoothing. It is important to note, that a.c. power as watts integrated over time is sinusoidal and not a straight line. Many electronic meters track a.c. energy exactly, i.e., sinusoidally. However, many electronic standards used for meter calibration are filtered to give the appearance of smoothing out the sinusoidal. Comparing two such different devices can result in differences between their readings. This phenomenon was not an issue with electromechanical meters, as they inherently exhibited heavily filtered characteristics.

Figure 1:
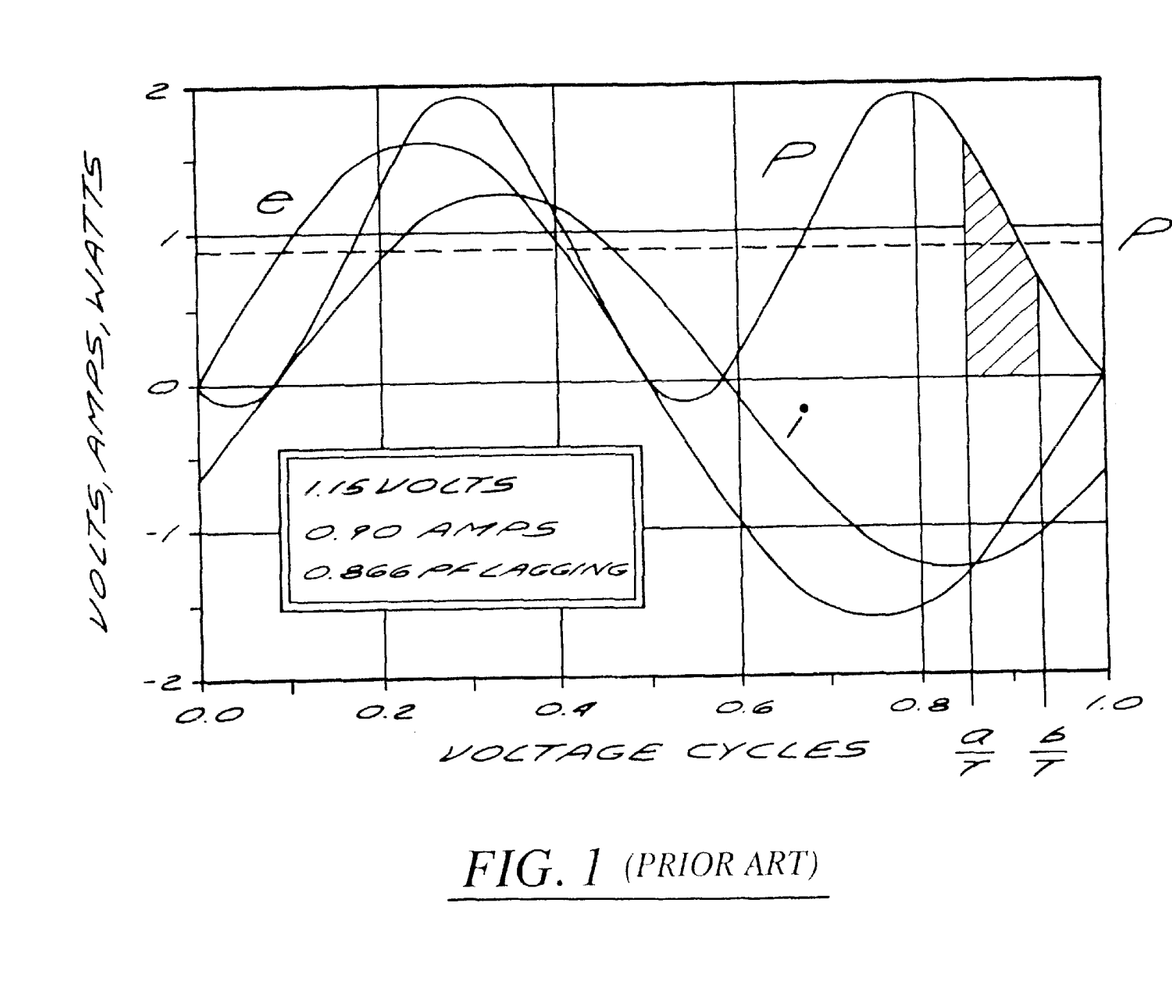
FIG. 1 is a plot of voltage cycles versus volts, amps, watts illustrating the cyclic nature of a.c. power.

Referring to FIG. 1, herein, labeled prior art, the cyclic nature of a.c. power is shown. By way of example, two meters having equal accuracy: the first, a heavily filtered meter, integrates average power with respect to time, and the second, an unfiltered meter, integrates instantaneous power with respect to time. The energy curves of these meters are compared, e.g., during a time interval 'a' to 'b'.

The unfiltered meter records energy proportional to the cross hatched area. The filtered meter will record in proportion to the area bounded by the vertical lines 'a/T' and 'b/T', the abscissa, and the average power line, the broken line designated 'P'. In this example, the cross hatched area is obviously larger; for other values of 'a' and 'b', it could be smaller or even the same.

Deviations that can occur in comparing meters are dependent on when in the voltage cycle, at 'a/T', the test starts and the test duration, defined by: $(b-a)/T$. As discussed hereinabove, the start is typically triggered by the meter under test (MTU) and usually not controlled. However, the prior art has addressed this problem by selecting a minimum comparison time which allows the limits of uncertainty to be managed.

Figure 2:
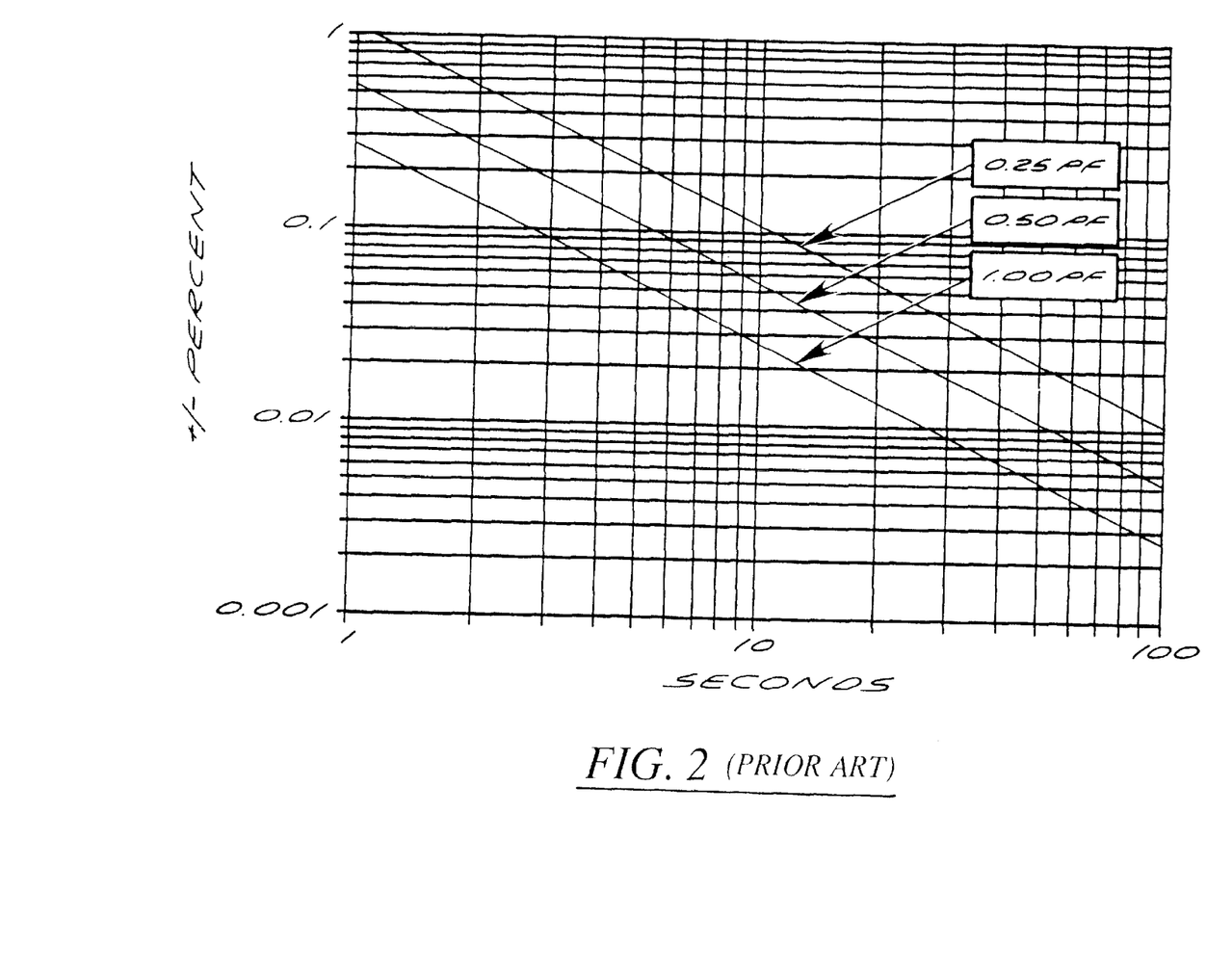
FIG. 2 is a plot of time versus percent uncertainty used in the prior art to aid in selecting minimum test time with a desired accuracy.

By way of example, referring to FIG. 2, herein, labeled prior art, a plot is shown which is used to aid in selecting minimum test times with a desired accuracy. In one example, with an acceptable level of uncertainty of ±0.05%, the intersection on the 1.00 PF line is at approximately 5.3 seconds. Accordingly, the test time must be greater than 5.3 seconds at 1.00 PF at 60 Hz to obtain a 0.01% level of uncertainty in the comparison. Twice and four times as long are needed for similar uncertainty levels of 0.50% and 0.25 PF respectively. In general, with all the other variations unchanged, the longer the test interval the less the relative uncertainty.

SUMMARY OF THE INVENTION

The above-discussed and other drawbacks and deficiencies of the prior art are overconie or alleviated by the high speed multifunction testing and calibration of electronic electricity meters of the present invention. In accordance with the present invention, start and end test commands defining a test interval synchronized to whole cycles of the pulsating a.c. potentials and currents are signaled by a meter under test (MUT) to a plurality of standard meters, during which multiple electrical quantities are accumulated by both the MUT and the standard meters. The MUT accumulated quantities and the accumulated quantities of the standard meters are communicated to the external test device for comparison. These comparisons may be used by the external test device to calculate coefficients for correcting or calibrating the MUT. The coefficients are transmitted to the MUT where they are incorporated into the algorithms for calculation of the desired electrical quantities.

Accordingly, it is an important feature of the present invention that testing time is significantly reduce over the prior art method. Further, it is an important feature of the present invention that multiple testing functions can be accomplished during this short time interval due to the recording of the accumulations of electrical quantities during the test interval, in effect, one test replaces a sequence of prior art tests.

The following steps are followed in the electronic electricity meter during testing:

(1) receiving, at the MUT, a test ready and length of test message from an external test assembly; the length of test being defined by an integer number of whole cycles of a source;

(2) switching the electronic electricity meter from a communication mode of operation to a test/calibration mode of operation;

(3) clearing test accumulators in the MUT and the external teat device;

(4) sending a synchronized test start signal from the MUT to the external test assembly;

(5) separately accumulating at least one measured electrical quantity of the source for each of the MUT and the external test assembly until the length of the test is exhausted;

(6) sending a synchronized test end signal from the MUT to the external test assembly;

(7) switching the MUT from the test/calibration mode of operation to the communication mode of operation;

(8) receiving a send test data message at the MUT from the external test assembly;

(9) sending the at least one accumulated measured electrical quantity from the MUTI to the external test assembly; and (10) verifying the at least one accumulated measured electrical quantity of the MUI with a corresponding at least one accumulated measured electrical quantity of the external test assembly.

The separately accumulated electrical quantities involved in a single test interval of multifunction electricity meters may be, but are not limited to, by element, or phase, and their totals: fundamental potential-squared hours, current-squared hours, Watthours, and varhours; fundamental plus harmonic potential-squared hours, current-squared hours, Watthours, and varhours; imputed neutral current-squared hours; apparent Volt-Ampere hours, and distortion Volt-Ampere hours.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

In general, the present invention comprises high speed, whole cycle synchronized, multifunction testing and calibration of an electronic electricity meter 10.

Figure 3:
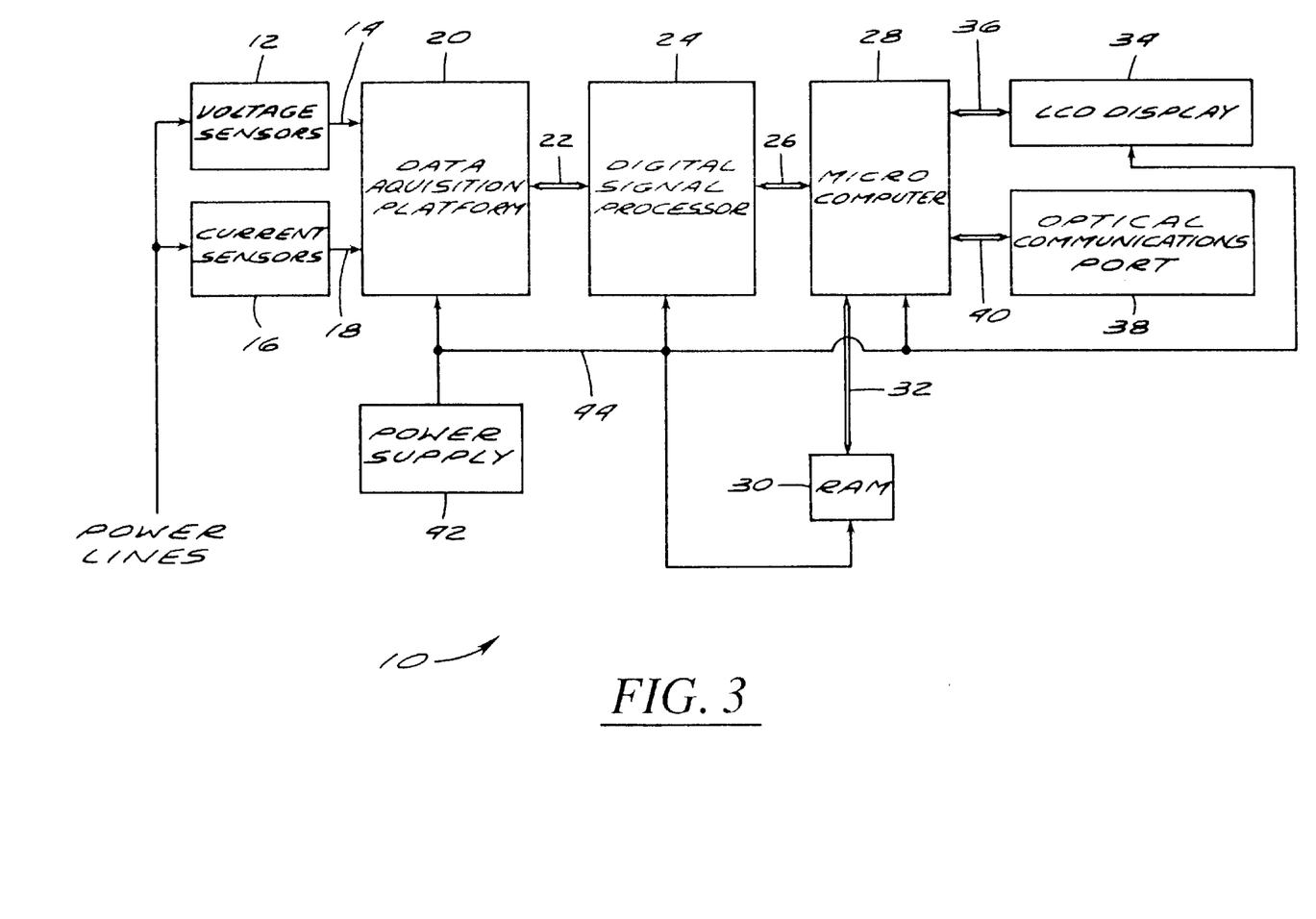
FIG. 3 is a schematic diagram of an electronic electricity meter in accordance with the present invention.

Referring to FIG. 3, a general schematic of electronic electricity meter 10, i.e., a meter under test (MUT), is generally shown. Meter 10 comprises a voltage sensor 12 which provides analog signals indicative of voltage measurements on a signal line 14 and a current sensor 16 which provides analog signals indicative of a current measurements on a signal line 18. The analog signals on lines 14 and 18 are presented to a data acquisition platform (DAP) 20, which converts these analog signals to digital signals. The digital signals are presented over a bus 22 to a digital signal processor (DSP) 24 where short interval calculations (e.g., energy calculations) are performed. These calculations are presented over a bus 26 to a microcomputer (MC) 28 which is capable of performing demand, TOU (time of use), reactive, KVA and other calculations. Meter 10 further includes RAM (random access memory) 30 which communicates with the microcomputer 28 over a control bus 32. It will be appreciated that the RAM is non-volatile so that system information and programming will not be lost during a power interruption or outage. Data, typically maximum demand, is displayed by a LCD (liquid crystal display) 34 in response to display signals received from microcomputer 28 over a signal line 36. Calibration, testing, programming and other features are accomplished through an optical communications I/O port 38, which communicates with microcomputer 28 over lines 40. Power supply 42 which is typically powered by the service electricity provides appropriate power over lines 44 to the components of meter 10.

MC 28 communicates with DSP 24 in several capacities. MC 28 writes configuration data to DSP 24 upon initialization. Some of that data gets passed on to DAP 20, while the rest defines different modes of processing the samples. DSP 24 has the ability to receive new coefficients for gain and phase correction. DSP 24 provides a frame of data for every interval of orthogonality which is 50 cycles of a 50 Hz system or 60 cycles of a 60 Hz system.

DSP 24 processes under steady state operation. Most of that processing is repetitive and must be done for every sampling interval. Processing is also performed in the background, i.e., the time in between completion of the present sample's processing to the start of the next samples' processing. DSP 24 acquires samples from the DAP 20 when it signals that it has data.

Figure 4:
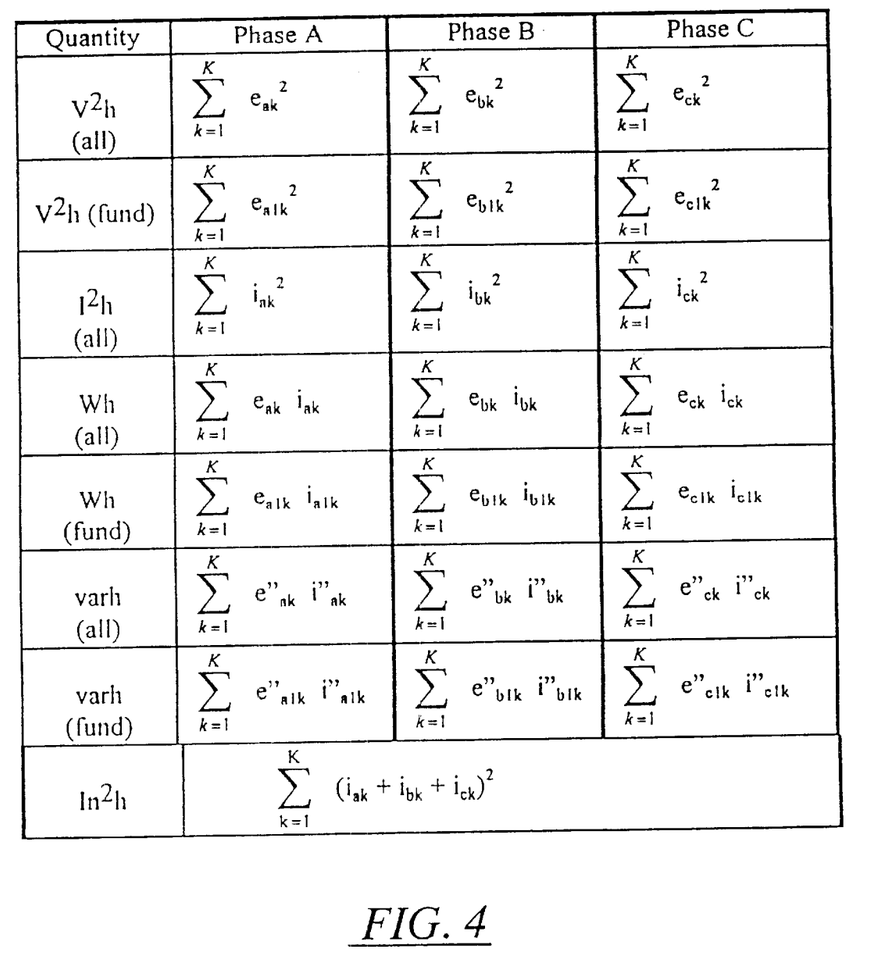
FIG. 4 is a table of metered values for the electronic electricity meter of FIG. 3.

Referring to FIG. 4, the values shown in the table are the metered values for MUT 60. Of these values, the $I^2_1$ values are dropped because they may be unambiguously derived from other values in the table. Quantities with the subscript "1" exclude all harmonic content. The value K is the number of samples in a momentary interval. The interval, in the present example, is defined to be the nominal number of cycles for the frequency of in hertz of the source, e.g., for a 60 Hz source the interval will be 60 cycles. For each accumulation cell shown above, 32 bits of storage in data RAM are required. After each sample is processed, all accumulation cells must be updated. When the momentary interval is complete, 16-bit windows of the accumulated values are transmitted to MC 28. The window is the most significant word (MSW) of the accumulated value.

To optimize the operation of DSP 24, many operations are performed every other sample. In particular, accumulation and filter evaluation of narrow band filtered signals are done every other sample. To preserve orthogonality, momentary intervals always contain an even number of samples so that each accumulation is guaranteed to be composed of the same number of samples.

For each momentary interval, the total energy is added to an accumulator with a specified threshold. When that threshold is exceeded, a pulse is issued. The pulses are used to drive an light emitting diode (LED) used in calibration and adjustment procedures.

DSP 24 also counts the zero crosses of the input or source. This is accomplished by tracking a weighted phasor (vector) sum of the three input voltages which have had all non-fundamental components filtered out (narrow band filtered). This vector sum guarantees that the presence of any phase of voltage allows time to be kept properly. This, in combination with another low pass filter stage should take care of any undesired zero crosses. Only positive going zero cross counts are recorded. These are used to count cycles and determine when to end a momentary interval. As long as valid zero crosses are being detected, MC 28 keeps time from the DSP interrupts which occur as frequently as MC 28 has specified. Detecting zero crosses is required for sampling. MC 28 processes the samples to determine its frequency content.

Any data transmitted to DSP 24 is considered configuration data. The configuration data is processed by DSP 24 for steady state operation, i.e., after initializing. DSP 24 in the operating mode accumulates measurement over momentary intervals. MC 28 reads out the accumulated data after each interval. Momentary intervals are measured using zero crossings on a selected phase of voltage.

The communication master may only write commands, while the slave may only write data. It is the responsibility of the MC to let the DSP be communications master so it may initiate commands. All commands which affect critical data (e.g., calibration, configuration, thresholds) are issued by the DSP when it is the master. When the MC is the master, it sets the commands (SCM) it wants the DSP to execute. The MC then makes the DSP the master.

Figure 5:
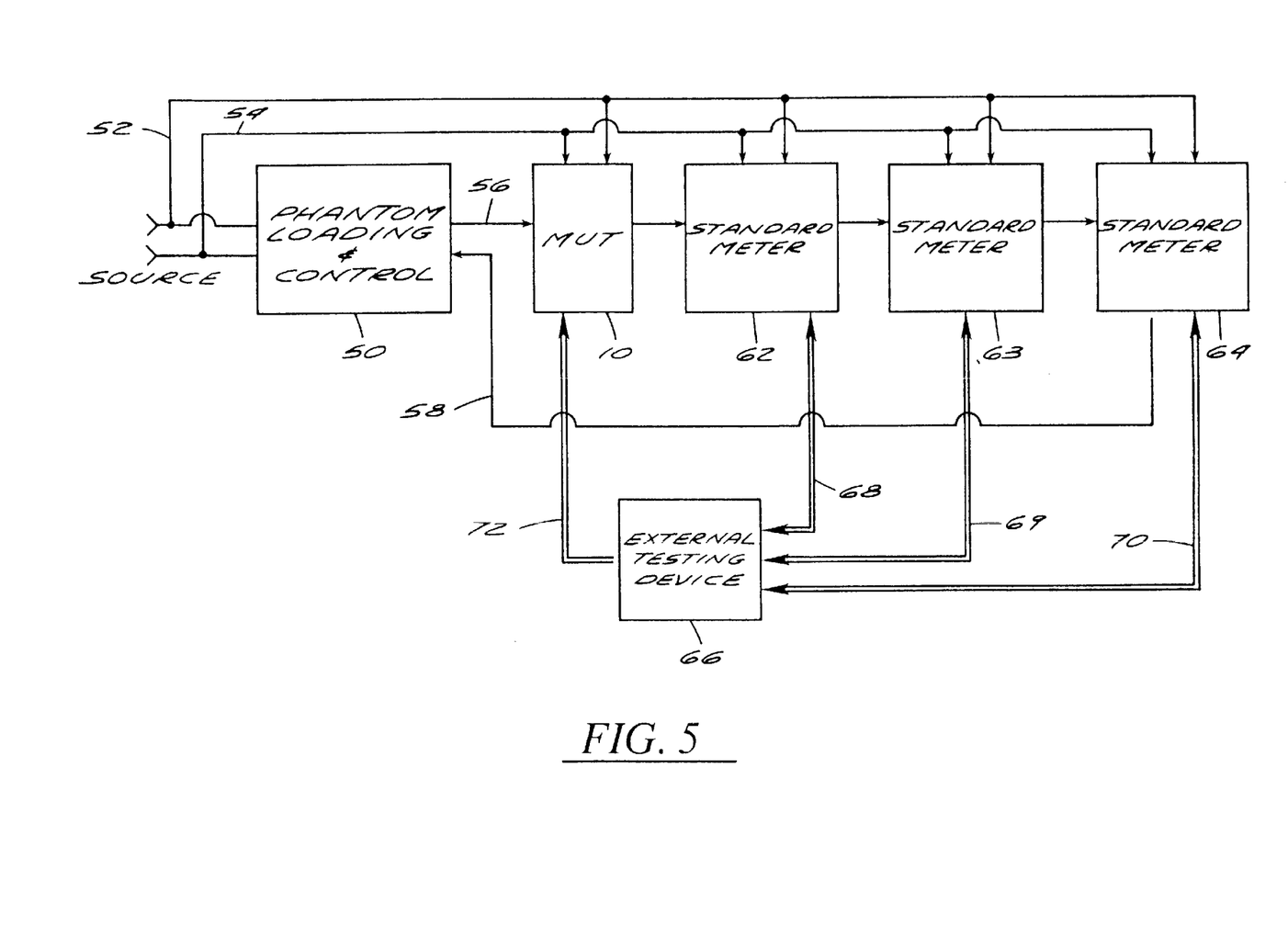
FIG. 5 is a block diagram of a testing/calibration configuration in accordance with the present invention.

Referring to FIG. 5, a phantom loading and control circuit 50 connected to a supply or input, lines 52, 54, is connected by lines 56, 58 to MUT 10 and a plurality of standard meters 62–64. Phantom loading is well known in the art, reference being made to the Handbook For Electricity Metering, Ninth Edition, published by the Edison Electric Institute. In general, phantom loading comprise a small power transformer, which is connected to the source, and an adjustable loading resistance (or an adjustable source with a fixed resistance). Start and end commands defining a test interval synchronized to an integer number of whole cycles of the pulsating a.c. potentials and currents of the source is signaled to standard meters 62–64 by MUT 10. Since MUT 10 samples and accumulates energy in whole cycles (i.e., with detection of the zero crossings, as described above, the test interval is also defined in whole cycles. By way of example, with a 60 Hz source a test interval could be the time it takes for the MUT to detect the 60 cycles. This would be exactly one second providing that there are no variations in the source frequency, i.e., it is maintained at exactly 60 Hz. Accordingly, MUT 10 would initiate the start of the test interval, count the 60 cycles, then initiate the end or stop of the test interval.

Multiple electrical quantities are accumulated by MUT 10, during the test interval. Multiple electrical quantities are also accumulated by an external test device (e.g., a computer) 66 from the standard meters 62–64 over lines 68–70, respectively. Multiple electrical quantities can be tested as multiple standard meters are used, one for each of electrical quantities. It is within the scope of the present invention, that a single standard meter could be used, providing it generated a standard for each of the electrical quantities, e.g., similar to the MUT. The method of the present invention, significantly improves testing time as compared to the prior art when more than one electrical quantity is to be tested. In the prior art a separate test was run for each electrical quantity to be tested, using a standard meter dedicated to testing that particular electrical quantity.

Further, as described above, the quantities accumulated by the external device 66 from the standard meters 62–64 are only for the count of the 60 cycles. Moreover, since the MUT and the standard meters are reading the same source, of which the MUT is counting cycles (it must be remembered that these are whole cycles), the uncertainty of the prior art minimum test time method is eliminated. The use of whole cycles eliminates the necessity to use longer test intervals of the prior art, which are required for averaging out the effect of the MUT and the standard meter not starting and stopping at the same point in a cycle, i.e., not whole cycles.

MUT 10 accumulated quantities are communicated to the external test device 66, over a line 72, for comparison with the accumulated quantities of the standard meters 62–64. It is within the scope of the present invention that the standard meters and the external test device could be incorporated into a single test unit are assembly. These comparisons may be used by the external test device 66 (e.g., a computer such as a PC) to calculate coefficients for correcting or calibrating the MUT 10. The coefficients are transmitted to the MUT 10 where they are incorporated into the algorithms for calculation of the desired electrical quantities.

The separately accumulated electrical quantities involved in a single test interval of multifunction electricity meters may be, but are not limited to, by element, or phase, and their totals: fundamental potential-squared hours (volt-squared hours), current-squared hours (amp-squared hours), Watthours (energy), and varhours (quadergy); fundamental plus harmonic potential-squared hours, current-squared hours, Watthours, and varhours (quadergy); imputed neutral current-squared hours; apparent Volt-Ampere hours, and distortion Volt-Ampere hours.

In summary, the following steps are followed in the MUT during testing:

(1) receiving, at the MUT, a test ready and length of test message from an external test assembly; the length of test being defined by an integer number of whole cycles of a source;

(2) switching the electronic electricity meter from a communication mode of operation to a test/calibration mode of operation;

(3) clearing test accumulators in tie MUT and the external teat device;

(4) sending a synchronized test start signal from the MUT to the external test assembly;

(5) separately accumulating at least one measured electrical quantity of the source for each of the MUT and the external test assembly until the length of the test is exhausted;

(6) sending a synchronized test end signal from the MUT to the external test assembly;

(7) switching the MUT from the test/calibration mode of operation to the communication mode of operation;

(8) receiving a send test data message at the MUT from the external test assembly;

(9) sending the at least one accumulated measured electrical quantity from the MUT to the external test assembly; and (10) verifying the at least one accumulated measured electrical quantity of the MUT with a corresponding at least one accumulated measured electrical quantity of the external test assembly.

Figure 6A:
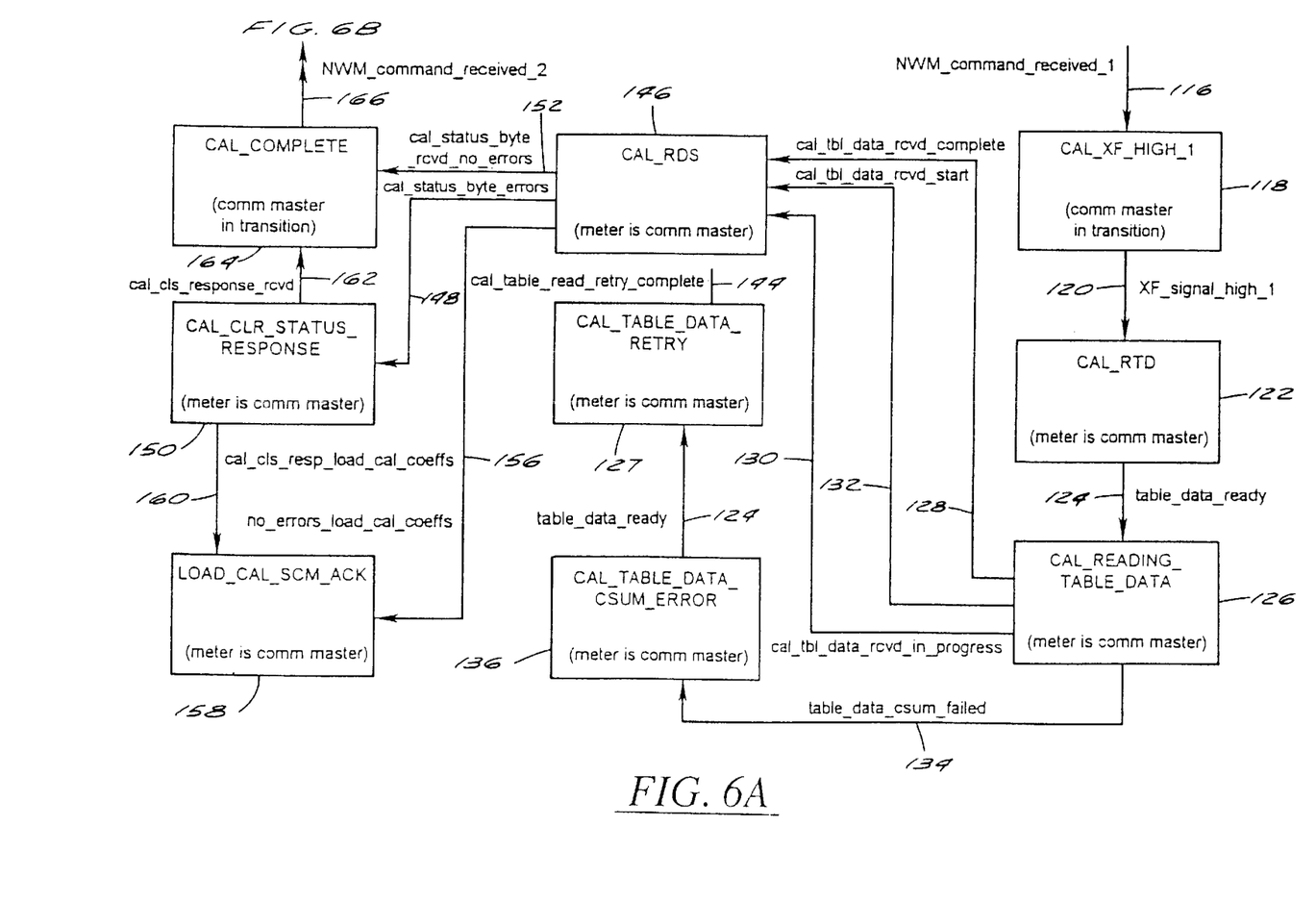
FIGS. 6A and B are a software structure chart of the testing/calibration procedures in accordance with an example of the present invention.
Figure 6B:
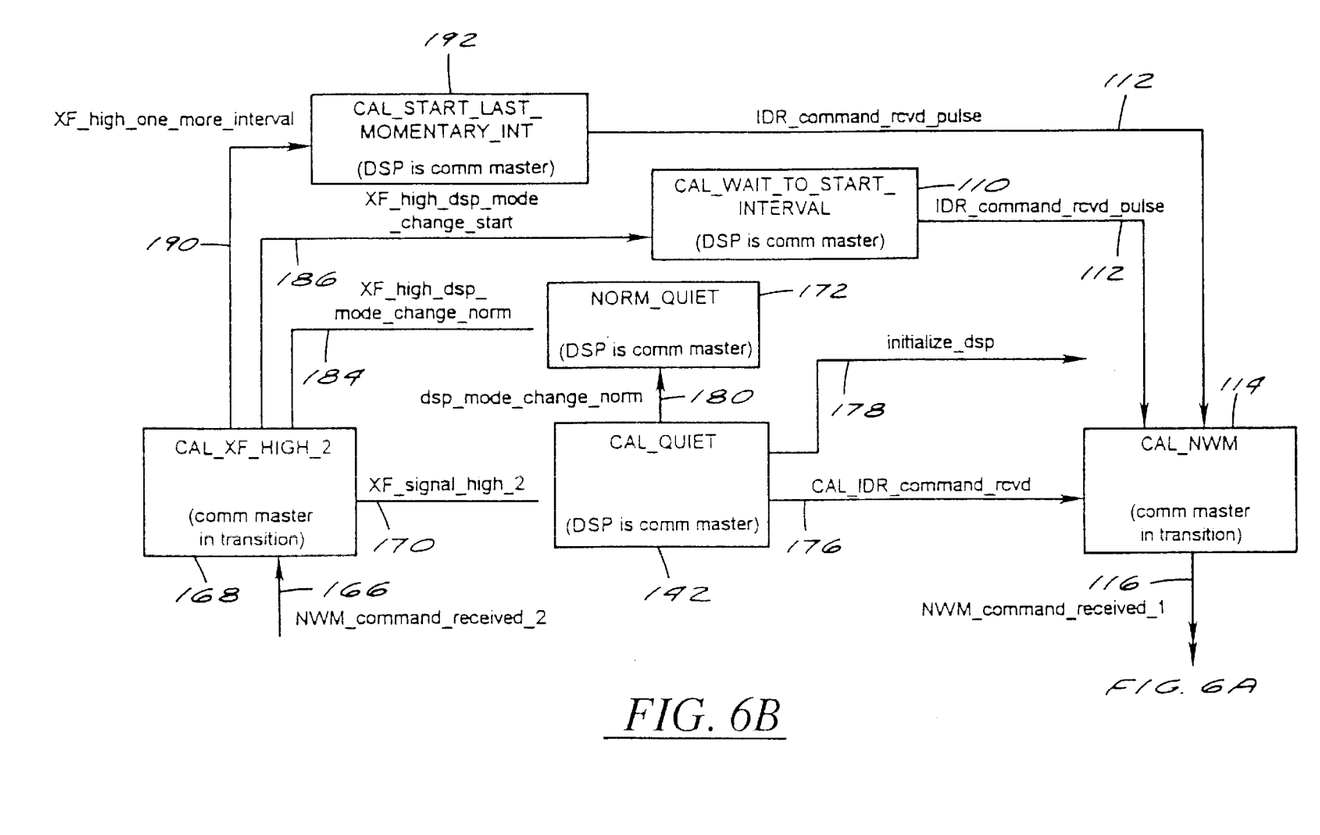

By way of an example, referring to FIGS. 6A and B, a software structure chart of the testing/calibration procedures of the present invention is generally shown.

In a CAL_WAIT_TO_START_INTERVAL state, i.e., block 110, the meter is waiting for the DSP 24 to send an IDR (Interval Data Ready) command, which marks the start of a calibration interval. The IRD command is issued when the DSP has completed processing a momentary interval. It signals the MC that it may read out the interval data. Successful transmission of this command clears the IDR flag in the Command Byte. The IDR_command_rcvd_pulse, line 112, occurs when the DSP 24 interrupts the meter and the meter reads the IDR command from the DSP 24. At this point the send_cal_pulse( ) is performed, MC_MSTR line is set to zero, set_dsp_comm_timout (TRUE) is performed, dsp_cal_mode_data.cal_task_count is set to zero, DSP24_interface_status is set to CAL-NWM, and the interrupt service routine exits.

In a CAL_NWM state, block 114, the meter is waiting for the NWM (New Master) command from the DSP 24. The NWM_command_received-1 transition, line 116, occurs when the DSP 24 interrupts the meter and an NWM command is read from the DSP 24. The NWM command is issued as part of a sequence that is executed whenever the communication master changes, i.e., the XF signal is brought low, the NWM command is transmitted, and the signal is brought high. At this point the RTD (Read Table Data) command is sent to the DSP 24, dsp_interface_status is set to NORM_RTD (in normal mode) or CAL_RTD (in calibration mode), a call is made to set_dsp_comm_timeout (TRUE), momentary_interval_data_pointer is set to the top of the momentary interval measurement data memory, dsp_status_byte, which will be used for the table data checksum, is set to zero, and the interrupt service routine exits. The RTDcommand is a request for the DSP to send its interval data. In the normal mode, the MC will issue this command after receiving an Interval Data Ready message (and asserting REG_MSTR).

In a CAL_XF_HIGH_1 state, block 118, the meter is reading the XF signal from the DSP 24 and checking it to determine if it has gone high. The XF signal going high is an acknowledgment from the DSP 24 that the task of switching communication master is complete. If the XF signal does not go high after a number (e.g., 5) DSP 24 sample times, the DSP 24 is reset and initialized. This is determined by looking at the Timer C interrupt request flag. The XF_signal_high_1 signal, line 120, occurs when the XF signal from the DSP 24 goes high after it has sent the NWM command. It is an acknowledgment from the DSP 24 that the meter is the communication master. At this point the RTD (Read Table Data) command is sent tot he DSP 24, dsp_interface_status is set to NORM_RTD (in normal mode) or CAL RTD (in calibration mode), a call is made to set_dsp_comm_timeout (TRUE), momentary_interval_data_pointer is set to the top of the momentary interval measurement data memory, dsp_status_byte, which will be used for the table data checksum, is set to zero, and the interrupt service routine exits.

In a CAL_WRFD state, block 122, the meter is waiting for the first byte of table data to be available from the DSP 24. The table_data_ready transition, line 124, occurs when the DSP 24 interrupts the meter indicating that the first byte of the table data is ready to be read. The data byte is read from the DSP 24, stored in the memory location pointed to by memory_interval_data_pointer, XORed with dsp_status_byte (which is used as the table data checksum), and momentary_interval_data_pointer is incremented. In normal mode the dsp_interface_status is set to NORM_READING_TABLE_DATA (if this is the first attempt at reading the table data) or TABLE_DATA_RETRY (if this is the second attempt at reading the table data). In the calibration mode the dsp_interface_status is set to CAL_READING_TABLE_DATA, block 126, or CAL_TABLE_DATA_RETRY, block 127. Also, in normal mode only, vsqh_data_available is set to DATA_NOT_AVAILABLE. Finally, a call is made to set_dsp_comm_timeout (TRUE) and interrupt service routine exits.

In a CAL_READING_TABLE_DATA state, block 126, the meter is reading the table data from the DSP 24. Each time the interrupt occurs, the interrupt service routine reads the byte from the DSP 24, stores it in the location pointed to by momentary_interval_data pointer, XORs the byte with the dsp_status_byte (used as the table data checksum), and updates momentary_interval_data_pointer. A call is then made to set_dsp_comm_timeout (TRUE), and the interrupt service routine exits. It will be noted that all the momentary interval data is stored in contiguous memory and in the order in which it is received from the DSP 24. The ca_tbl_data_rcvd_complete transition, line 128, occurs when the meter has read the last byte of the table data from the DSP 24 during calibration mode and a calibration interval is not in progress (i.e., cal_interval_count equals zero). At this point the RDS (Read Status) command is sent to the DSP 24, the dsp_interface_status is set to CAL_RDS, a call is made to set_dsp_comm_timeout (TRUE), and the interrupt service routine exits. The table data is not added to the calibration interval accumulators. The cal_tbl_data_rcvd_in_progress transition, block 130, occurs when the meter has the last byte of the table data from the DSP 24 during calibration mode, the checksum at the end of the table data is correct, and a calibration interval is in progress (i.e. cal_interval_count is greater than zero and bit 7 of dsp_cal_mode_status equals zero). At this point the table data is added to the calibration interval accumulators, the RDS (Read Status) command is sent to the DSP 24, the dsp_interface_status is set to CAL_RDS, a call is made to set_dsp_comm_timeout (TRUE), and the interrupt service routine exits. The cal_tbl_data_rcvd_start transition, line 132, occurs when the meter has read the last byte of the table data from the DSP 24 during calibration mode and a calibration interval is just starting (i.e. bit 7 of dsp_cal_mode_status equals one). At this point the RDS (Read Status) command is sent to the DSP 24, the dsp_interface_status is set to CAL_RDS, a call is made to set_dsp_comm_timeout (TRUE), and the interrupt service routine exits. The table data is not added to the calibration interval accumulators.

The table_data_csum_failed transition, line 134, occurs when the checksum sent with the table data is incorrect. When this happens, another RTD (Read Table Data) command is set to the DSP 24, the dsp_$_{interface}$_status is set to TABLE_DATA_CSUM_ERROR (in normal mode) or CAL_TABLE_DATA_CSUM_ERROR (in calibration mode), block 136, a call is made to set_dsp_comm_timeout (TRUE), dsp_status_byte is set to zero, momentary_interval_data_pointer is set to the top of the momentary interval measurement data memory, and the interrupt service routine exits, allowing the meter to return to background processing.

During the CAL_TABLE_DATA_RETRY state, block 127, the meter is reading the table data from the DSP 24. Each time the interrupt occurs, the interrupt service routine reads the byte from the DSP 24, stores it in the location pointed to by momentary_interval_data_pointer, XORs the byte with the dsp_status_byte (used as the table data checksum), and updates momentary_interval_data_pointer. The DSP 24 interface is in the CAL_QUIET mode, block 142, between momentary intervals during the calibration mode. In this state the meter is waiting for the DSP 24 to send its status byte. During this state the meter is reading the table data from the DSP 24. Each time the interrupt occurs, the interrupt service routine reads the byte from the DSP 24, stores it in the location pointed to by momentary interval data pointer, XORs the byte with the dsp_status_byte (used as the table data checksum), and updates momentary_interval_data_pointer. It will be noted, that all the momentary interval data is stored in contiguous memory and in the order in which it is received from the DSP 24. A call is then made to set_dsp_comm_timeout (TRUE), and the interrupt service routine exits.

The cal_table_read_retry_complete transition, line 144, occurs during calibration mode when the second table data read is complete. If a calibration interval is not in progress (i.e. cal_interval_count equals zero), the RDS commad is sent to the DSP 24, the interface_status is set to CAL_RDS, block 146, a call is made to set_dsp_comm_timeout (TRUE), and the interrupt service routine exits. The table data is not added to the calibration interval accumulators. If a calibration interval is in progress (i.e. cal_interval_counit is greater than zero and bit 7 of DAP 20_cal_mode_status is zero), the table data is added to the calibration interval accumulators, bit I of the dsp_cal_mode_status byte is set to 1 if the checksum was incorrect, the RDS (Read Status) command is sent to the DSP 24, the dsp_*interface*_status is set to CAL_RDS, block 146, a call is made to set_dsp_comm_timeout (TRUE), and the interrupt service routine exits. If a calibration interval is just starting (i.e. bit 7 of dsp_cal_mode_status equals 1), the RDS command is sent to the DSP 24, the dsp_*interface*_status is set to CAL_RDS, block 146, a call is made to set_dsp_comm_timeout (TRUE), and the interrupt service routine exits. The table data is not added to the calibration interval accumulators. The CAL_RDS waits for the DSP 24 to send its status byte.

The calstatus_byte_errors transition, line 148, occurs when the DSP 24 interrupts the meter, the meter receives the status byte from the DSI 24, and the status byte indicates that one or more of the following errors occurred; data overrun error, data overflow error, no zero cross detected in 128 samples. The following sequence is performed:

test interval to an exact number of cycles, absolute uncertainty from this phenomenon is constant. The cal_status_byte rcvd_no_errors transition, line 152, occurs when the DSP 24 interrupts the meter, the meter receives the status byte from the DSP 24, dsp_mode_data.next_dsp mode does not equal dsp_LOAD_CAL_MODE, and the status byte indicates that no errors occurred during the last momentary interval. The following sequence is performed:

---

```
IF cal_interval_count > 0 and bit 7 of dsp_cal_mode_status = 0
    decrement cal_interval_count
        IF cal_interval_count = 0
            bit 6 of dsp_cal_mode_status = 0
            dsp_cal_mode_data.current_dsp_mode = DSP_CALIBRATION_MODE
            dsp_cal_mode_data.next_dsp_mode = DSP_CALIBRATION_MODE
        ENDIF
ELSE IF bit 7 of dsp_cal_mode_status 1
    bit 7 of dsp_cal_mode_status = 0
ENDIF
```

---

The MC_MSTR line is set to 1, dsp_interface_status is set to CAL_COMPLETE, a call is made to set_dsp_comm_timeout (TRUE), and the interrupt service routine exits.

The no_errors_load_cal_coeffs transition, line 156, occurs when the DSP 24 interrupts the meter, the meter receives the status byte from the DSP 24, dsp_mode_data.next_dsp_mode equals DSP_LOAD_CAL_MODE, and the status byte indicates that no errors occurred during the last momentary interval. The dsp_mode_data.next_dsp_mode is set to DSP_LOAD_CAL_MODE when a request to load the DSP 24 calibration coefficients (by calling load_new_cal_coeffs ( )) is made. Rather than interrupting momentary interval processing or having to handle the possible confusion that would arise if loading the new coefficients were attempted to just as an interval ended, the request is acknowledged at the end of momentary interval processing.

---

```
IF cal_interval_count > 0 and bit 7 of dsp_cal_mode_status = 0
    decrement cal_interval_count
    set the appropriate bit(s) in the dsp_cal_mode_status byte to indicate the type of
error(s) that occurred
        If cal_interval_count = 0
        bit 6 of dsp_cal_mode_status = 0
        dsp_mode_data.current_dsp_mode = DSP_CALIBRATION_MODE
        dsp_cal_mode_data.next_dsp_mode = DSP_CALIBRATION_MODE
        ENDIF
ELSE IF bit 7 of dsp_cal_mode_status = 1
    bit 7 of dsp_cal_mode_status = 0
ENDIF
```

---

The meter sends the DSP 24 the CLS (Clear Status) command, dsp_interface is set to CAL_CLR_STATUS_RESPONSE, block 150, a call is made to set_dsp_comm_timeout (TRUE), and the interrupt service routine exits. In the CAL_CLR_STATUS_RESPONSE state, block 150, the meter is waiting for the Clear Status common acknowledgment byte from the DSP 24. Without synchronizing the The SCM (set Commands) command is set to the DSP 24 with the GCC (Get Calibration Coefficients) flag set, the dsp_interface_status is set to LOAD_CAL_SCM_ACK, dsp_mode_data.current_dsp_mode is set to DSP_LOAD_CAL_MODE, a call is made to set_dsp_comm_timeout (TRUE), dsp_cal_mode_data.dsp_cal_mode_status is set to zero, and dsp_cal_mode_data.cal_ interval_count is set to zero. The interrupt service routine then exits. The momentary interval processing is complete.

In a LOAD_CAL_SCM_ACK state, block 158, the meter is waiting for the acknowledgment byte (00H) for the SCM (Set Commands) from the DSP 24.

The cal_cls_resp_load_cal_coeffs transition, line 160, occurs when the DSP 24 interrupts the meter and the DSP 24 sends its response to the CLS (Clear Status) command, and dsp_mode_data.next_dsp_mode equals DSP_LOAD_CAL_MODE. The dsp_mode_data.next_dsp_mode is set to DSP_LOAD_CAL_MODE when a request to load the DSP 24 calibration coefficients (by calling load_new_cal_coeffs( )) is made. Rather than interrupting momentary interval processing or having to handle the possible confusion that would arise if loading the new coefficients were attempted just as an interval ended, the request is acknowledged at the end of momentary interval processing.

The SCM (Set Commands) command is sent to the DSP 24 with the GCC (Get Calibration Coefficients) flag set, the DSP 24 interface status is set to LOAD_CAL_SCM_ACK, dsp_mode_data.current_dsp_mode is set to DSP_LOAD_CAL_MODE, a call is made to set_dsp_comm_timeout (TRUE), dsp_cal_mode_data.dsp_cal_mode_status is set to zero, and dsp_cal_mode_data.cal_interval_count is set to zero. The interrupt service routine then exits. The momentary interval processing is complete.

The cals_cls_response_rcvd transition, line 162, occurs when the DSP 24 interrupts the meter and the DSP 24 sends its response to the CLS (Clear Status) command, and dsp_mode_data.next_dsp_mode does not equal DSP_LOAD_CAL_MODE. At this point the MC_MSTR line is set to 1, dsp_interface_status is set to CAL_COMPLETE, block 164, a call is made to set_dsp_comm_timeout (TRUE), and the interrupt service routine exits. In the CAL_COMPLETE state, block 164, the meter is waiting for the NWM (New Master) command from the DSP 24.

The NWM_command_received_2 transition, line 166, occurs when the DSP 24 interrupts the meter and an NWM (New Master) command is read from the DSP 24. At this point the dsp_$_{interface}$_status is set to NORM_XF_HIGH_2 (in normal mode) or CAL_XF_HIGH_2 (in calibration mode), and a call is made to set_dsp_comm_timeout (TRUE). The interrupt service routine does not exit in this case.

In a CAL-XF_HIGH_2 state, block 168, the meter is reading the XF signal from the DSP 24 and checking it to determine if it has gone high. The XF signal going high is an acknowledgment from the DSP 24 that the task of switching communication master is complete. If the XF signal does not go high after 5 DSP 24 sample times, the DSP 24 is reset and initialized. This is determined by looking at the Timer C interrupt request flag.

The XF_signal_high_2 transition, line 170, occurs when the XF signal from the DSP 24 goes high after it has sent the NWM (New Master) command and DSP 24 mode data.next_dsp_mode equals dsp_mode_data:current_dsp mode. At this point the dsp_interface_status is set to NORM_QUITE, block 172, (in normal mode) or CAL_QUIET, block 142, (in calibration mode), a call is made to set_dsp_comm_timeout (FALSE), a call is made to set DSP 24 comm timeout (FALSE), the interrupt service routine exits, and the momentary interval processing is complete.

The CAL_IDR_command_rcvd transition, line 176, occurs when the DSP 24 interrupts the meter and an IDR (Interval Data Ready) command is read from the DSP 24. At this time the MC_MSTR line is set to zero, the dsp_interface_status is set to CAL_NWM, block 114, dsp_cal_mode_data.cal_task_count is set to zero, and a call is made to set_dsp_comm_timeout (TRUE). The interrupt service routine (dsp_data_ready_isr) does not wait for the NWM (New Master) command. Instead, it exits and the meter goes back to background processing.

The initialize_dsp transition, line 178, occurs whenever the intialize_dsp routine is called. It can happen at power up, when a DAP 20 or DSP 24 error occurs, or when a momentary interval timeout occurs. The sequence of events that occur when this routine is called is described in the data flow diagram descriptions.

The dsp_mode_change_norm transition, line 180, occurs when the communication module calls set_dsp_cal_mode (FALSE) and momentary interval processing is not in progress. In this case dsp_mode_data.next_dsp_mode and dsp mode_data.current_dsp_mode are set to DSP_NORMAL_MODE and dsp_$_{interface}$_status is set to NORM_QUIET, block 172. The DSP 24 interface is in the NORM_QUIET mode between momentary intervals.

The XF_high_dsp_mode_change_norm transition, line 184, occurs when the XF signal from the DSP 24 goes high after it has sent the NWM (New Master) command and dsp_mode_data.next_dsp_mode=DSP_NORMAL_MODE. This happens when a request to change the DSP 24 interface mode (by calling set_DAP 20_cal_mode (TRUE)) happens in the middle of momentary interval processing. Rather than interrupt the momentary interval processing, the request is acknowledged at the end of processing. At this point the dsp_$_{interface}$_status is set to NORM_QUIET, block 172, dsp_mode_data.current_os_mode is set to DSP_NORMAL_MODE, a call is made to set_dsp_comm_timeout (FALSE), and the interrupt service routine exits. The momentary interval processing is complete.

The XF_high_dsp_mode_change_start transition, line 186, occurs when the XF signal from the DSP 24 goes high after it has sent the NWM (New Master) command and dsp_mode_data.next_dsp_mode=DSP_CAL_INTERVAL_MODE. The dsp_mode_data.current_dsp_mode=DSP_CAL_INTERVAL MODE, dsp_cal_mode data.dsp_cal_mode_status is set to COH (start of calibration interval),dsp_cal_mode_data.cal_interval_count=dsp_cal_mode_data.temp_interval_count,dsp_cal_mode_data.cal_task_count=0, zero out calibration interval accumulators, call set_dsp_comm_timeout (FALSE), dsp_$_{interface}$_status=CAL_WAIT_TO_START_INTERVAL, block 110, and return from interrupt.

The XF_high_one_more_interval transition, line 190, occurs when the XF signal from the DSP 24 goes high after it has sent the NWM (New Master) command and dsp_cal_mode_data.cal_interval count=1. The call set_dsp_comm_timeout (FALSE) and dsp_interface_status= CAL_START_LAST_MOMENTARY_INT, block 192. The meter waits for the DSP 24 to send an IRD command, which marks the end of the calibration interval, i.e., CAL_START_LAST_MOMENTARY_INT, block 192.

Accordingly, it is an important feature of the present invention that testing time is significantly reduced and certain testing uncertainties are eliminated as compared to the prior art method. Further, it is an important feature of the present invention that multiple testing functions can be accomplished during this short time interval due to the recording of the accumulations of electrical quantities during the test interval, in effect, one test replaces a sequence of prior art tests.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A test configuration comprising:

an electronic electricity meter connected to a source and a load for measuring at least one electrical quantity of the source, said electronic electricity meter having a test/calibration mode of operation wherein test start and test end commands are generated in accordance with a test interval, said test interval being defined by an integer number of whole cycles of the source;

at least one standard meter connected to the source and the load for measuring said at least one electrical quantity of the source; and a test device connected to said electronic electricity meter and said at least one standard meter, said test device for comparing said measurement of said at least one electrical quantity of the source during said test interval by said electronic electricity meter with said measurement of said at least one electrical quantity of the source during said test interval by said at least one standard meter.

2. The configuration of claim 1 wherein:

said test device determines calibration coeficients for said electronic electricity meter from said comparison of said measurement of said at least one electrical quantity of the source during said test interval by said electronic electricity meter with said measurement of said at least one electrical quantity of the source during said test interval by said at least one standard meter; and said electronic electricity meter being receptive to said calibration coeficients, said calibration coeficients being used for calculating said measurement of said at least one electrical quantity, whereby said electronic electricity meter is calibrated.

3. The configuration of claim 1 wherein:

said at least one electrical quantity comprises a plurality of electrical quantities; and said at least one standard meter comprises a plurality of standard meters, each of said standard meters corresponding to one of said electrical quantities.

4. The configuration of claim 1 wherein:

said at least one electrical quantity comprises a plurality of electrical quantities.

5. The configuration of claim 5 wherein said at least one electrical quantity comprises by element, or phase, or their totals: fundamental potential-squared hours, current-squared hours, Watthours, or varhours; or fundamental plus harmonic potential-squared hours, current-squared hours, Watthours, or varhours; or imputed neutral current-squared hours; apparent Volt-Ampere hours, or distortion Volt-Ampere hours.

6. A test configuration comprising:

an electronic electricity meter connected to a source and a load for measuring at least one electrical quantity of the source, said electronic electricity meter having a test/calibration mode of operation wherein test start and test end commands are generated in accordance with a test interval, said test interval being defined by an integer number of whole cycles of the source; and at least one standard meter connected to the source and the load for measuring said at least one electrical quantity of the source, said at least one standard meter being responsive to said test start and test end commands.

7. The configuration of claim 6 wherein:

said at least one electrical quantity comprises a plurality of electrical quantities; and said at least one standard meter comprises a plurality of standard meters, each of said standard meters corresponding to one of said electrical quantities.

8. The configuration of claim 6 wherein:

said at least one electrical quantity comprises a plurality of electrical quantities.

9. The configuration of claim 6 wherein said at least one electrical quantity comprises by element, or phase, or their totals: fundamental potential-squared hours, current-squared hours, Watthours, or varhours; or fundamental plus harmonic potential-squared hours, current-squared hours, Watthours, or varhours; or imputed neutral current-squared hours; apparent Volt-Ampere hours, or distortion Volt-Ampere hours.

10. An electronic electricity meter connected to a source and a load for measuring at least one electrical quantity of the source, wherein the improvement comprise:

said electronic electricity meter having a test/calibration mode of operation wherein test start and test end commands are generated in accordance with a test interval, said test interval being defined by an integer number of whole cycles of the source.

11. The electronic electricity meter of claim 10 wherein:

said at least one electrical quantity comprises a plurality of electrical quantities.

12. The electronic electricity meter of claim 10 wherein said at least one electrical quantity comprises by element, or phase, or their totals: fundamental potential-squared hours, current-squared hours, Watthours, or varhours; or fundamental plus harmonic potential-squared hours, current-squared hours, Watthours, or varhours; or imputed neutral current-squared hours; apparent Volt-Ampere hours, or distortion Volt-Ampere hours.

* * * * *